(12) United States Patent
Deleonibus

(10) Patent No.: US 6,727,179 B2
(45) Date of Patent: Apr. 27, 2004

(54) METHOD FOR CREATING AN INTEGRATED CIRCUIT STAGE WHEREIN FINE AND LARGE PATTERNS COEXIST

(75) Inventor: Simon Deleonibus, Claix (FR)

(73) Assignee: Commissariat A l'Energie Atomique, Paris (FR)

( * ) Notice: Subject to any disclaimer, the term of this patent is extended or adjusted under 35 U.S.C. 154(b) by 0 days.

(21) Appl. No.: 10/296,197

(22) PCT Filed: Jun. 14, 2001

(86) PCT No.: PCT/FR01/01850
§ 371 (c)(1),
(2), (4) Date: Nov. 29, 2002

(87) PCT Pub. No.: WO01/96957
PCT Pub. Date: Dec. 20, 2001

(65) Prior Publication Data
US 2003/0077899 A1 Apr. 24, 2003

(30) Foreign Application Priority Data
Jun. 16, 2000 (FR) .............................................. 00 07718

(51) Int. Cl.⁷ ..................... H01L 21/311; H01L 21/302; H01L 21/461
(52) U.S. Cl. ....................... 438/694; 438/717; 438/736; 438/737; 438/950
(58) Field of Search ................................. 438/694, 717, 438/735, 736, 737, 753, 950; 216/46

(56) References Cited

U.S. PATENT DOCUMENTS

| | | | |
|---|---|---|---|
| 4,612,274 A | | 9/1986 | Cho et al. .................... 430/296 |
| 5,670,423 A | | 9/1997 | Yoo ............................ 438/587 |
| 5,776,821 A | * | 7/1998 | Haskell et al. .............. 438/585 |
| 6,350,695 B1 | * | 2/2002 | Tae et al. .................... 438/694 |
| 6,416,933 B1 | * | 7/2002 | Singh et al. ................ 439/313 |
| 6,429,052 B1 | * | 8/2002 | Gardner et al. ............. 438/142 |
| 6,521,138 B2 | * | 2/2003 | Chen et al. .................. 216/59 |
| 2003/0040018 A1 | * | 2/2003 | Kotani ........................ 438/696 |

FOREIGN PATENT DOCUMENTS

EP    0 779 556    6/1997

\* cited by examiner

Primary Examiner—Mary Wilczewski
Assistant Examiner—Toniae M. Thomas
(74) Attorney, Agent, or Firm—Oblon, Spivak, McClelland, Maier & Neustadt, P.C.

(57) ABSTRACT

Successive use is made of a layer of radiation-sensitive resin at points intended to form wide semi-conductor patterns in a still intact layer, under at least one hard mask, then of a resin sensitive to particle bombardment over fine patterns to be formed in this same layer, which may be juxtaposed to those previously mentioned. The first resin patterns are exposed collectively and rapidly by insolation, while electron bombardment allows fine patterns to be formed with great precision. Another hard mask is deposited before the second resin and forms flanks around the wide patterns, which protect the wide patterns from lateral attacks during etching.

8 Claims, 5 Drawing Sheets

Figure 1A:
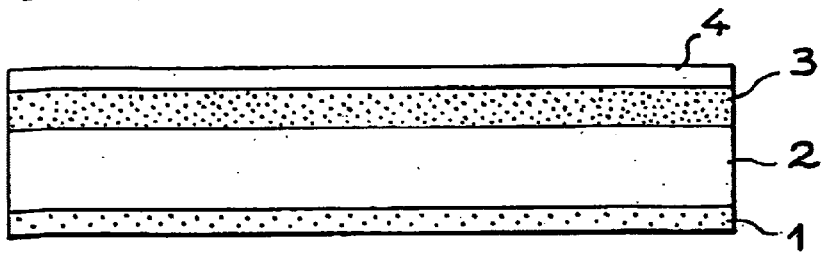

METHOD FOR CREATING AN INTEGRATED CIRCUIT STAGE WHEREIN FINE AND LARGE PATTERNS COEXIST

The subject of this invention is a process for creating an integrated circuit stage where fine patterns and wide patterns, particularly semi-conductors, coexist.

The technique is known of etching semi-conductor layers so as to leave remaining only isolated patterns, which will be part of the integrated circuit. This is achieved particularly by depositing a hard mask on the semi-conductor layer, which is subsequently removed from the portions to be etched in such a way that it shields the patterns which are to be protected against etching. Use is generally made of another etching stage in respect of removing the mask at unnecessary points, after depositing resin over the portions of the mask which need to be protected. The resin is deposited in a continuous layer which is exposed, in other words subjected to conditions which sensitise it, either over the portions for protection by the mask, or over the other portions, depending on whether a so-called "negative" or "positive" resin is concerned. A resin development stage then removes it from places other than the portions for protection by the mask. Finally the remainder of the resin is removed when the mask has been etched.

Two main processes exist for exposing the resin: radiation, particularly by ultraviolet light or X-rays, and particle bombardments, particularly by electrons or also ions, etc., often carried out by beam scanning. Depending on their composition, resins are in practice sensitive to one or the other of these processes. Radiation allows the resin to be exposed collectively and the patterns to be marked out therefore in one go. On the other hand, it may be noted that they do not allow semi-conductor patterns to be obtained subsequently with great precision of dimension, which makes them unsuitable when the patterns it is required to produce are fine, since the inaccuracies then become excessive.

Particle bombardments make it possible on the other hand to achieve patterns with great precision but only expose the resin slowly, the beam having to be moved gradually over the whole surface to be exposed. When wide and fine patterns coexist, the general use of particle bombardment, made necessary however by the presence of fine patterns, leads to inordinate fabrication times.

It is therefore useful in this technical sector to allow the joint use of radiation and particle bombardments in forming the wide and fine patterns respectively (typically, 100 nm and 20 nm widths respectively) of the integrated circuit stage, without the application of radiation having a damaging effect on the formation of fine patterns, and reserving particle bombardment for fine patterns so as not to increase the stage fabrication time more than is necessary.

An article by Tedesco and others "Resist process of hybrid (electron-beam/deep ultraviolet) lithography" which appeared in the Journal of Vacuum Science and Technology, B16 (6), Nov.–December 1998, pp 3676–3683, mentions the possibility of using a "mixed" resin, able to be exposed both to radiation and to particle beams; but such resins are not optimum either for one exposition process nor for the other.

The use of hard masks in place of resin has also been proposed so as to allow fine patterns to be etched with precision; but resins remain more convenient to use.

The patent EP-A-0 779 556 relates to a process for creating an integrated circuit stage including patterns, particularly semi-conductors, some first of which have widths above a threshold and some second of which have widths below the threshold, consisting in depositing a layer of pattern material on a substrate, a mask on the layer of pattern material, then an upper layer on the mask, a first resin which is exposed and developed subsisting only on the first patterns still to be formed, in etching the upper layer, in eliminating the first resin, in depositing a second resin which is exposed and developed subsisting on the second patterns still to be formed, in etching the mask where it is visible, in etching the layer of pattern material, thus forming the first and second patterns, where it is visible, and in removing the second resin.

Some of the first patterns may be adjacent to some of the second patterns. In accordance with what has already been disclosed, the first resin is generally sensitised by exposure to radiation and the second resin is sensitised by exposure to particle bombardment. Prior to initiating the etching of the upper layer in the first case, the etching of the pattern material layer in the second case, the exposed resin is developed.

The upper layer is to advantage made of the pattern material and completely removed when the pattern material layer is etched.

It is intended to perfect a process like the one in this patent EP-A-0 779 556 using steps which consist in etching the mask where it is visible after etching the upper layer, then in depositing a second mask after removing the first resin, and in etching the second mask where it is visible after depositing the second resin.

Indeed, the second mask may form flanks around residues of the first mask deposited on the pattern material layer, and these flanks subsist until the pattern material layer is etched.

One effect of this particular process is that the first patterns may be formed with a broadened base under the flanks of the second mask, which is advantageous if these patterns are MOS transistors.

Another effect is that the flanks maintain the width of the wide patterns by protecting them against the lateral attacks which would have caused them to contract during etching of the pattern material layer.

Figure 1B:
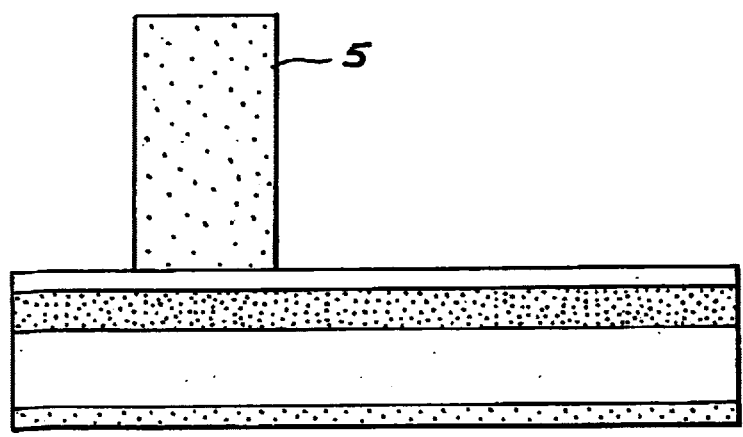
Figure 1C:
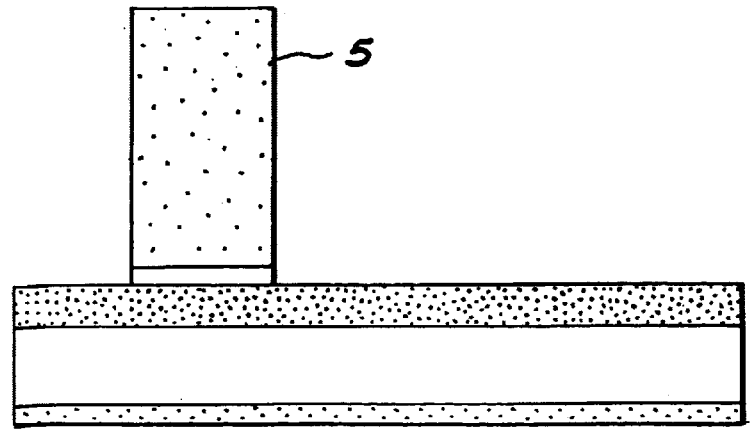
Figure 1D:
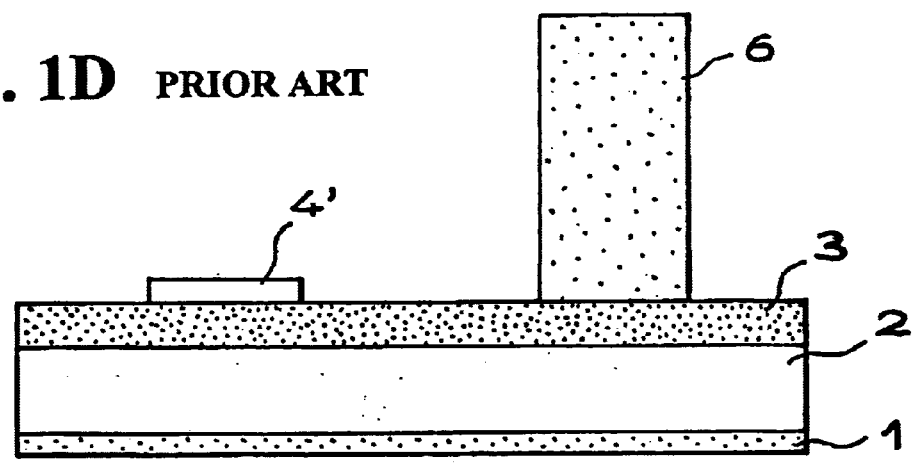
Figure 1E:
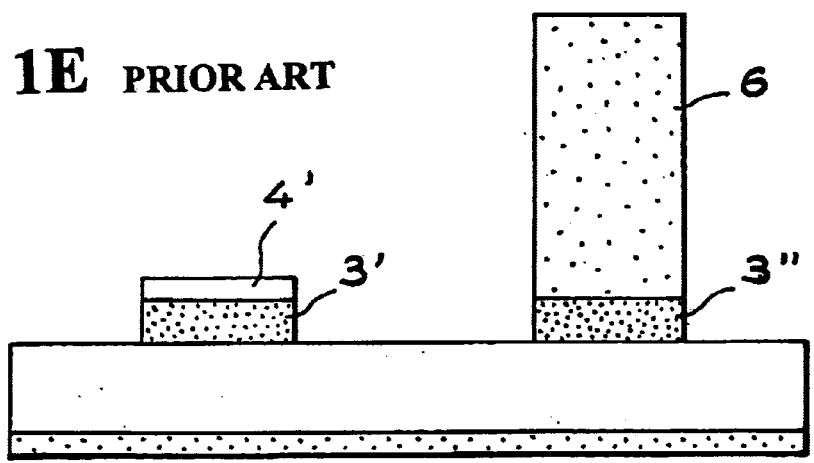
Figure 1F:
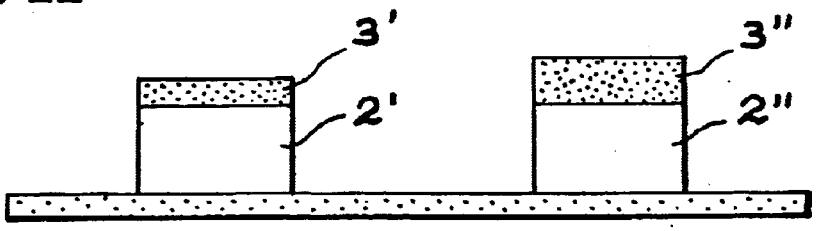
Figure 2A:
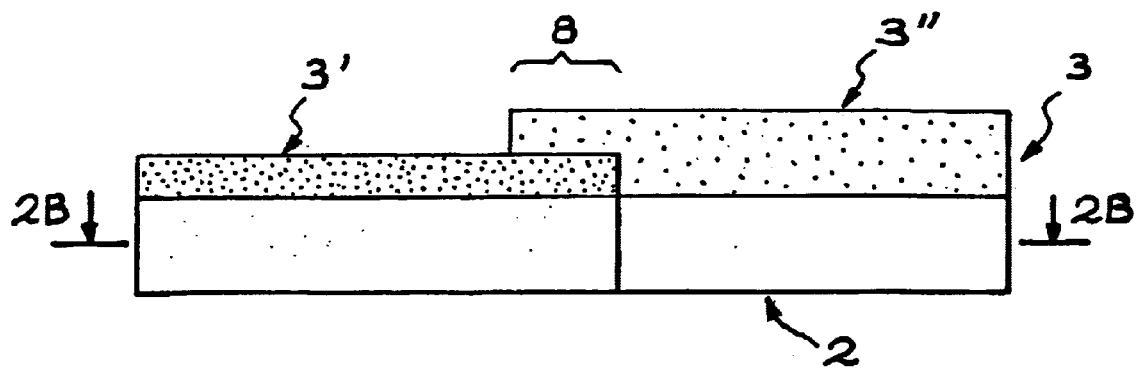
Figure 2B:
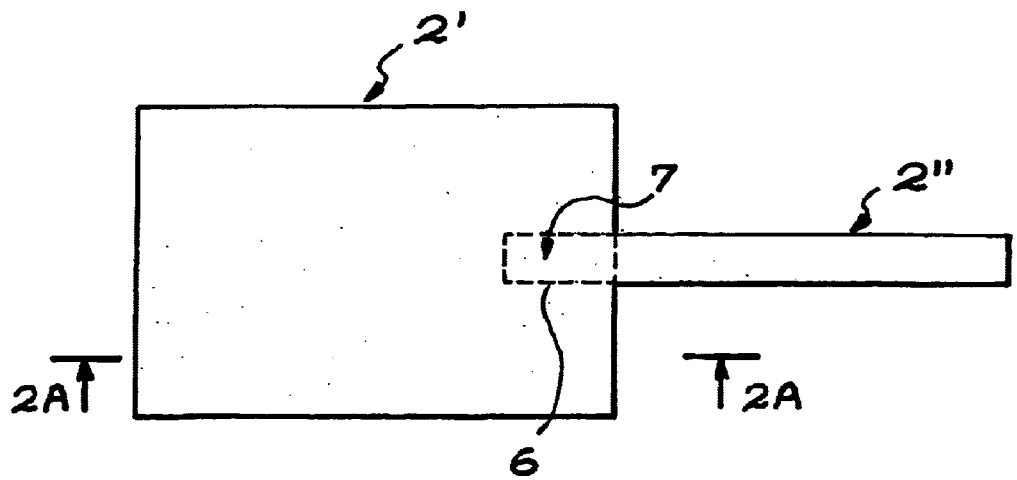

The invention will be described in more detail using practical embodiments disclosed non-exhaustively in the following figures:

FIGS. 1A to 1F are steps in an operation of a general process of creating wide and fine patterns, which the invention does not relate to, FIGS. 2A and 2B are two views of typical connected patterns, and FIGS. 3A to 3E show the operation of a process characteristic of the invention.

In FIG. 1A there has been deposited on a substrate 1, which may consist of a barrier layer of silicon oxide ($S_iO_2$), a semi-conductor layer 2 which may be of polycrystalline silicon or silicon nitride in which semi-conductor gate patterns will have to be etched, a hard mask 3 which may be of silicon oxide has been deposited on the semi-conductor layer 2 and an upper semi-conductor layer 4, possibly of the same composition as the layer 2, has been deposited on the hard mask 3.

Next, as is shown in FIG. 1B, radiation-sensitive resin 5 is deposited, exposed and developed subsisting over the portion of the upper layer 4 which will overhang the wide patterns to be etched in the semi-conductor layer 2.

An initial etching of the upper layer 4 is then undertaken in accordance with FIG. 1C, except at points where it is coated by the radiation-sensitive resin 5.

The radiation-sensitive resin 5 may then be removed by exposure for example to an oxygen plasma, before a particle sensitive resin 6 is deposited on the hard mask 3, which has been previously stripped, then exposed and developed subsisting only over the fine patterns to be engraved in the layer 2. This is the state shown in FIG. 1D. Residues 4' of the semi-conductor layer 4 which subsist over the wide patterns are not or are only slightly attacked when the resin 6 is developed then removed.

FIG. 1E shows that the next stage consists of an etching of the hard mask 3 where it is visible, leaving it to subsist only at points of the future wide and fine patterns of the semi-conductor layer 2; it forms residues there, 3' and 3" respectively, which are protected by the residues 4' of the semi-conductor layer 4 and by the particle sensitive resin 6 respectively.

FIG. 1F shows the state obtained at the end of the process, after the resin 6 has been subsequently removed for example by an oxygen plasma, then finally when the semiconductor material has been etched, leaving it to subsist only at the wide 2' and fine 2" patterns under the residues 3' and 3" of the hard mask which are also left to subsist so that they produce an electrical insulation in the integrated circuit whose fabrication will be pursued via other steps. Chemical anisotropic etching can be used with one of the following products: $HB_r$, $Cl_2$, $O_2$ or $CF_4O_2$. The residues 3' of the wide patterns 2' may have in practice been somewhat attacked and are therefore left thinner than the residues 3"; this is however acceptable.

As can be seen in FIGS. 2A and 2B, the wide and fine patterns 2' and 2" may be absolutely adjacent. It would be useful then for the particle sensitive resin 6 deposited at the stage in FIG. 1D to overlap somewhat the residues 4', which has been shown by the portion 7 in FIG. 2B. The difference in levels between the residues 3' and 3" is then separated from the junction of the patterns 2' and 2" by a guard distance 8, which offers a better connection.

One embodiment of the invention will now be described using FIGS. 3A to 3E.

Figure 3A:
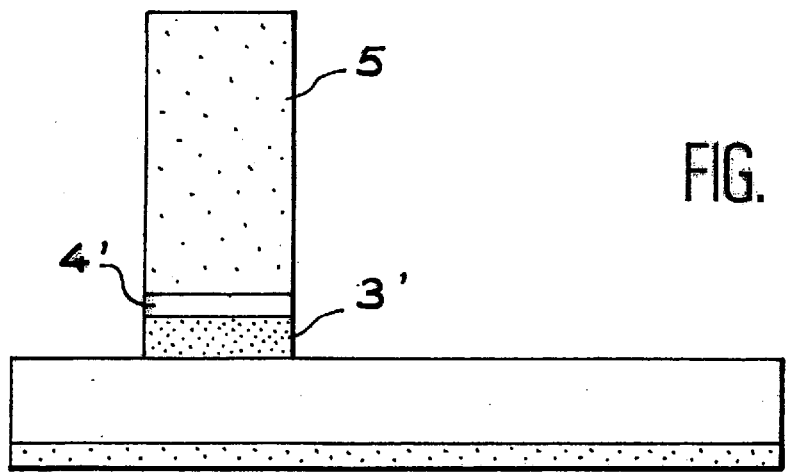
Figure 3B:
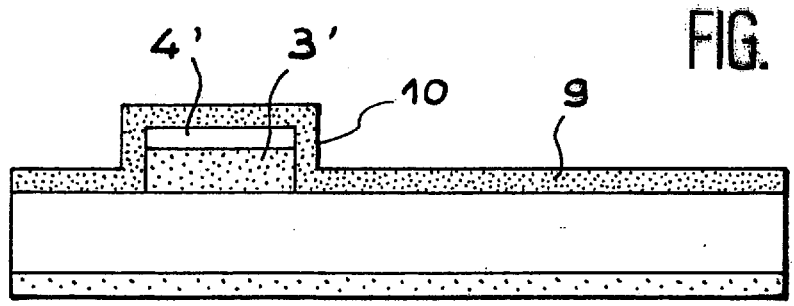
Figure 3C:
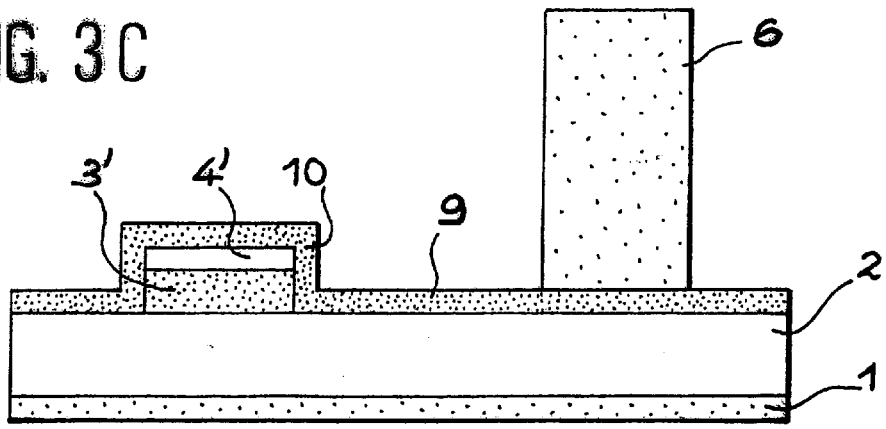
Figure 3D:
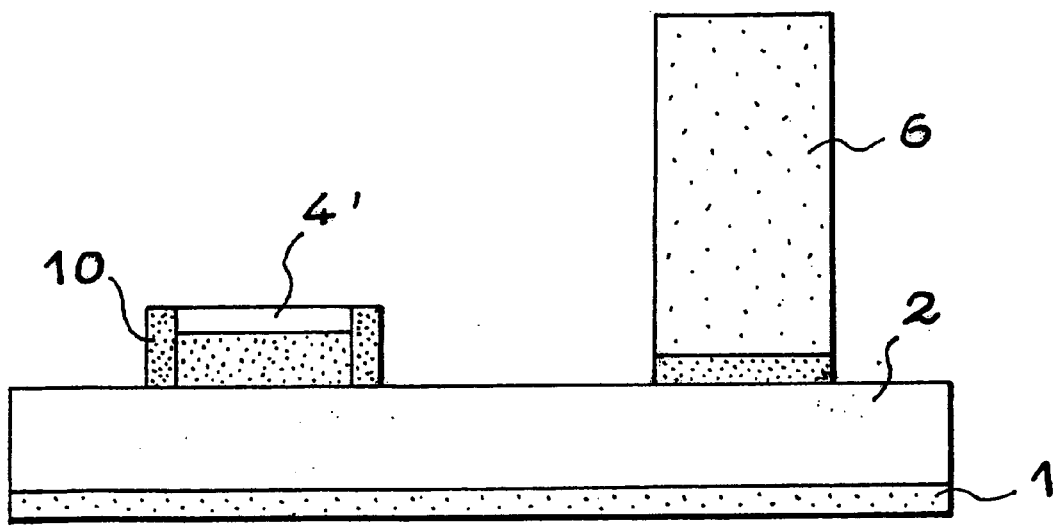
Figure 3E:
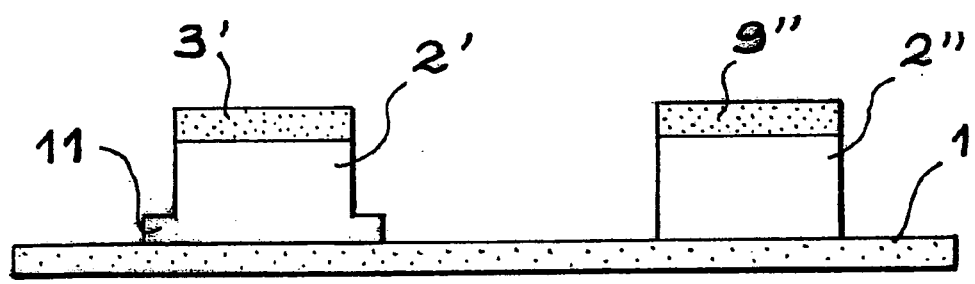

FIG. 3A is obtained from the state in FIG. 1C after etching of the hard mask 3 which has left only the residues 3' remaining. The radiation-sensitive resin 5 is then removed, and a second mask 9 is deposited over the whole structure so obtained; it forms a horizontal layer, except in approximately vertical flanks 10 which surround the residues 3' and 4' at the wide pattern points, which is shown in FIG. 3B. FIG. 3C shows that the particle sensitive resin 6 is then deposited over the fine patterns and on the second mask 9, before the latter is removed elsewhere by appropriate etching, except however from the flanks which have remained shielded, in accordance with the state in FIG. 3D. The final steps in the process consist in removing the particle sensitive resin 6 and in etching the semi-conductor material, which makes the residues 4' disappear and above all the portions of the layer 2 which were not coated with the hard masks. A certain degree of attack on the hard masks does however occur, which makes all or part of the flanks 10 disappear while leaving remaining one portion at least of the residues 3' on the wide patterns 2' and 9" on the fine patterns 2"; likewise, the wide patterns 2" have a broadened base 11 under the locations of the former flanks 10. This broadened base 11 may be useful if the wide patterns 2' are intended to form high-voltage MOS transistors for example. Otherwise, it may be preferable to remove it, which may be accomplished by slightly prolonging the etching of the semiconductor material.

An essential advantage of the second mask 9 and above all of its flanks 10 is to protect the wide patterns 2' from lateral attacks produced during etching by radiation reflections which it is impossible to protect against and which would have shrunk the wide patterns 2' by an amount that is difficult to anticipate: the flanks 10 therefore guarantee that the wide patterns 2' are maintained at the required width.

In this process, the selectivity of etching, in other words the capacity it has to attack only one of the exposed materials while sparing the others, and which is only partial in practice, has particular importance by virtue of the significant number of different materials employed: the thickness of the masks 3 and 9 and of the upper layer 4 will be sufficient for us to reach the states given in the diagrams in respect of the materials and etching modes chosen, ensuring above all that residues such as 3', 4', and 3" are prevented from disappearing accidentally, following excessive etching. In other words, the etching of the semi-conductor layer 2 will be a rapid enough to leave only sufficient thickness of the hard masks 3 and 9 at the residues 3' and 9" Moreover, the first hard mask 3 must continue to resist even if the flanks 10 of the second hard mask 9 have disappeared. All these conditions may impose choices in respect of the materials, their thickness and the processes employed but the possibilities are numerous enough to offer solutions.

What is claimed is:

1. A process for creating an integrated circuit stage including patterns, in which a first group of the patterns have widths above a threshold and a second group of the patterns have widths below the threshold, comprising:

depositing a layer of pattern material on a substrate, depositing a first mask on the layer of pattern material, then depositing an upper layer on the first mask, depositing a first resin which is exposed and developed subsisting only on first patterns still to be formed;

etching the upper layer where the upper layer is visible;

removing the first resin;

depositing a second resin, which is exposed and developed subsisting on second patterns still to be formed;

etching the first mask where the first mask is visible;

etching the layer of pattern material, thus forming the first and second patterns, where the layer of pattern material is visible;

removing the second resin;

etching the first mask where the first mask is visible after etching the upper layer;

depositing a second mask after removing the first resin; and etching the second mask where the second mask is visible after depositing, exposing, and developing the second resin.

2. A process for creating an integrated circuit stage according to claim 1, wherein the second mask forms flanks around residues of the first mask deposited on the pattern material layer, which are only removed when the pattern material layer is etched.

3. A process for creating an integrated circuit stage according to claim 2, wherein the process is controlled such that the first patterns are formed with a broadened base under the flanks of the second mask.

4. A process for creating an integrated circuit stage according to claim 1, wherein the first resin is exposed by radiation and the second resin is exposed by particle radiation.

5. A process for creating an integrated circuit stage according to claim 4, wherein the radiation is light radiation and the particle radiation utilizes electrons.

6. A process for creating an integrated circuit stage according to claim 1, wherein the second resin is exposed by beam scanning.

7. A process for creating an integrated circuit stage according to claim 1, wherein some of the first patterns are adjacent to some of the second patterns.

8. A process for creating an integrated circuit stage according to claim 1, wherein the upper layer is made of the pattern material and is completely removed when the pattern material layer is etched.

* * * * *